(12) United States Patent
Isohata

(10) Patent No.: US 9,391,586 B2
(45) Date of Patent: Jul. 12, 2016

(54) RESONATOR DEVICE, ELECTRONIC DEVICE, AND MOVING OBJECT

(71) Applicant: Seiko Epson Corporation, Tokyo (JP)

(72) Inventor: Kensaku Isohata, Minowa (JP)

(73) Assignee: Seiko Epson Corporation (JP)

( * ) Notice: Subject to any disclaimer, the term of this patent is extended or adjusted under 35 U.S.C. 154(b) by 415 days.

(21) Appl. No.: 14/088,798

(22) Filed: Nov. 25, 2013

(65) Prior Publication Data

US 2014/0145559 A1 May 29, 2014

(30) Foreign Application Priority Data

Nov. 29, 2012 (JP) ................................. 2012-260742

(51) Int. Cl.
*H01L 41/047* (2006.01)
*H01L 41/053* (2006.01)
*H03H 9/02* (2006.01)
*H03H 9/10* (2006.01)
*H03H 9/05* (2006.01)

(52) U.S. Cl.
CPC ......... *H03H 9/02102* (2013.01); *H03H 9/1021* (2013.01); *H03H 9/0542* (2013.01)

(58) Field of Classification Search
CPC ...... H03H 3/04; F02M 61/167; G10K 11/004
USPC ................................. 310/311–371
See application file for complete search history.

(56) References Cited

U.S. PATENT DOCUMENTS

| 5,952,894 | A | 9/1999 | Fukiharu |
| 7,759,844 | B2 | 7/2010 | Miyahara et al. |
| 2008/0197755 | A1* | 8/2008 | Miyahara ............ H03H 9/0542 310/360 |
| 2011/0234047 | A1 | 9/2011 | Muraki et al. |
| 2015/0295557 | A1* | 10/2015 | Takase ................. H03H 9/0552 310/315 |

FOREIGN PATENT DOCUMENTS

| JP | 09-098023 | | 4/1997 |
| JP | 09-191226 | | 7/1997 |
| JP | 10-173475 | | 6/1998 |
| JP | 11-317625 | | 11/1999 |
| JP | 2004-343339 | A | 12/2004 |
| JP | 2005-286892 | A | 10/2005 |
| JP | 2007-201858 | A | 8/2007 |
| JP | 2008-205938 | A | 9/2008 |
| JP | 2010-118979 | A | 5/2010 |
| JP | 2011-211340 | A | 10/2011 |
| JP | 2012-080249 | A | 4/2012 |
| JP | 2012-080250 | A | 4/2012 |
| JP | 2012-099928 | A | 5/2012 |
| JP | 2012-182567 | A | 9/2012 |
| JP | 2013-058864 | A | 3/2013 |

* cited by examiner

*Primary Examiner* — Thomas Dougherty
(74) *Attorney, Agent, or Firm* — Harness, Dickey & Pierce, P.L.C.

(57) ABSTRACT

A quartz crystal vibrator includes a quartz crystal resonator element, a thermistor adapted to detect the temperature, and a package adapted to incorporate the quartz crystal resonator element and the thermistor, a plurality of electrode pads adapted to support the quartz crystal resonator element is disposed on an inner bottom surface of the package, to which the quartz crystal resonator element and the thermistor are installed, and a wiring pattern, which is extracted from at least one electrode pad, and has a thermal conductivity higher than a thermal conductivity of a package base of the package including the inner bottom surface, overlaps the thermistor in a plan view.

9 Claims, 6 Drawing Sheets

RESONATOR DEVICE, ELECTRONIC DEVICE, AND MOVING OBJECT

BACKGROUND

1. Technical Field

The present invention relates to a resonator device, and an electronic apparatus and a moving object each equipped with the resonator device.

2. Related Art

In the past, as a resonator device, there has been known a piezoelectric vibrator (hereinafter referred to as a resonator device) having a configuration in which a temperature sensor (hereinafter referred to as a thermo-sensitive element) is installed in the vicinity of a piezoelectric raw plate (hereinafter referred to as a resonator element) located inside a container of the resonator device, and the output of the thermo-sensitive element is output to an external terminal of the resonator device (see, e.g., JP-A-2005-286892 (Document 1)).

Further, there has been known a quartz crystal vibrator (hereinafter referred to as a resonator device) having a configuration in which a container main body having a bottom wall layer and a frame wall layer, a quartz crystal element (hereinafter referred to as a resonator element) having one end portion fixed to one end of the bottom wall layer in the container main body, and a thermistor (hereinafter referred to as a thermo-sensitive element) housed inside the container main body together with the resonator element are provided, and the thermo-sensitive element is disposed inside a recessed section provided to the bottom wall layer (see, e.g., JP-A-2008-205938 (Document 2)).

It is conceived that the resonator devices of Document 1 and Document 2 described above can improve the accuracy of a temperature compensation circuit for compensating, for example, a variation in frequency with the temperature variation of the resonator element based on the detected temperature by the thermo-sensitive element by housing the resonator element and the thermo-sensitive element inside the container together with each other to thereby make the difference between the actual temperature of the resonator element and the temperature (apparent temperature of the resonator element) detected by the thermo-sensitive element as small as possible.

Incidentally, such a resonator device as described in Document 1 or Document 2 can be used for a position measurement of a global positioning system (GPS) installed in an electronic apparatus such as a cellular phone. In such a purpose, the short-term stability of a frequency of the resonator device is an extremely significant factor in improving the position measurement accuracy.

Due to the circumstances described above, a configuration capable of reducing the difference between the actual temperature of the resonator element and the temperature detected by the thermo-sensitive element in a shorter time is required for the resonator device described above.

SUMMARY

An advantage of some aspects of the invention is to solve at least a part of the problems described above, and the invention can be implemented as the following forms or application examples.

Application Example 1

A resonator device according to this application example includes a resonator element, a thermo-sensitive element, and a container in which the resonator element and the thermo-sensitive element are housed, wherein the container is provided with an electrode pad to which the resonator element is attached, and a wiring pattern, which extends from the electrode pad, and has a thermal conductivity higher than a thermal conductivity of the container, overlaps the thermo-sensitive element in a plan view.

According to this application example, in the resonator device, an electrode pad for supporting the resonator element is disposed on the mount surface of the container, on which the resonator element is mounted, and the wiring pattern, which is extracted from the electrode pad, and has a thermal conductivity higher than that of the container main body, overlaps the thermo-sensitive element in the plan view.

Thus, in the resonator device, the thermal conduction between the resonator element and the thermo-sensitive element is expedited compared to the case in which the wiring pattern extracted from the electrode pad fails to overlap the thermo-sensitive element in the plan view, and therefore, it is possible to reduce the difference between the actual temperature of the resonator element, which varies in accordance with the variation in ambient temperature, and the temperature detected by the thermo-sensitive element in a short time.

Application Example 2

In the resonator device according to the application example described above, it is preferable that an electrode terminal disposed on an outer surface of the container, wherein the wiring pattern is connected to the electrode terminal.

According to this application example, in the resonator device, since an electrode terminals is disposed on the outer surface of the container, and the wiring pattern overlapping the thermo-sensitive element in the plan view is connected to the electrode terminal, the wiring pattern can also be used for the connection between the resonator element and the electrode terminal in addition to the speeding-up of the thermal conduction in the application example 1, and thus, the efficient layout of the wiring pattern becomes possible.

Application Example 3

In the resonator device according to the application example described above, it is preferable that one end portion of the resonator element is attached to the electrode pad, and the thermo-sensitive element is disposed on an electrode pad side in the plan view.

According to this application example, in the resonator device, since the one end portion of the resonator element is attached to the electrode pads, and the thermo-sensitive element is disposed on the electrode pad side of the resonator element, the distance between the one end portion of the resonator element and the thermo-sensitive element is reduced compared to the case in which, for example, the thermo-sensitive element is disposed on the other end portion side opposite to the one end portion of the resonator element. In other words, the time until the temperature of the one end portion of the resonator element and the temperature of the thermo-sensitive element become roughly equal to each other is shortened.

As a result, in the resonator device, the difference between the actual temperature of the resonator element, which varies in accordance with the variation in the ambient temperature, and the temperature detected by the thermo-sensitive element can be reduced in a short time.

Application Example 4

In the resonator device according to the application example described above, it is preferable that one end portion of the resonator element is attached to the electrode pad, and the thermo-sensitive element is disposed on the other end portion side opposite to the one end portion of the resonator element in the plan view.

According to this application example, in the resonator device, since the one end portion of the resonator element is attached to the electrode pads, and the thermo-sensitive element is disposed on the other end portion side opposite to the one end portion of the resonator element, it is possible to easily avoid the interference (e.g., a short circuit of the resonator element and the thermo-sensitive element via an outflow of a fixation member) between the fixation members (e.g., an electrically-conductive adhesive) for respectively fixing the resonator element and the thermo-sensitive element inside the container when mounting (installing) the resonator element and the thermo-sensitive element in the container.

Application Example 5

In the resonator device according to the application example described above, it is preferable that the resonator element has a first dimension along a first direction, and a second dimension along a second direction perpendicular to the first direction, the second dimension being shorter than the first dimension, and the thermo-sensitive element is arranged side by side with the resonator element along the second direction in the plan view.

According to this application example, in the resonator device, since the thermo-sensitive element is arranged side by side with the resonator element along the second direction of the resonator element, the size of the container in the longitudinal direction can be reduced compared to the case in which, for example, the thermo-sensitive element is disposed side by side with the resonator element along the longitudinal direction of the resonator element.

Application Example 6

An electronic apparatus according to this application example includes the resonator device according to any one of the application examples described above.

According to this application example, since the electronic apparatus having the present configuration is provided with the resonator device according to any one of the application examples described above, there can be provided the electronic apparatus on which the advantages described in any one of the application examples described above are reflected.

Application Example 7

A moving object according to this application example includes the resonator device according to any one of the application examples described above.

According to this application example, since the moving object having this configuration is provided with the resonator device according to any one of the application examples described above, there can be provided the moving object on which the advantages described in any one of the application examples described above are reflected.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments in which the invention is put into practice will hereinafter be explained with reference to the accompanying drawings.

First Embodiment

Firstly, a quartz crystal vibrator as an example of a resonator device will be explained.

Figure 1A:
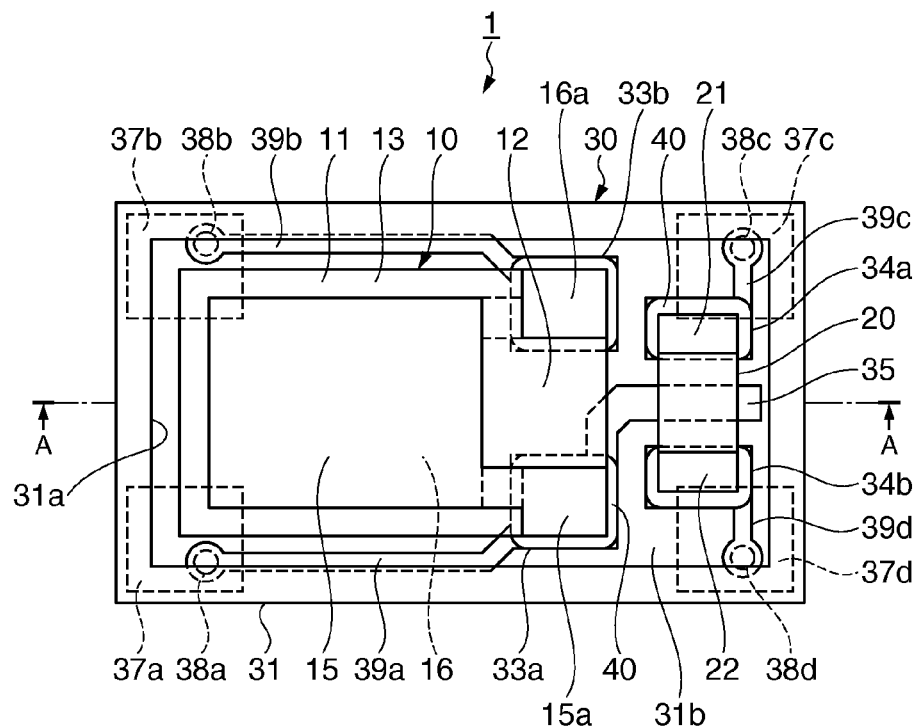
FIG. 1A is a schematic plan view, which shows a general configuration of a quartz crystal vibrator according to a first embodiment of the invention, and is looked down from a lid (lid member) side.
Figure 1B:
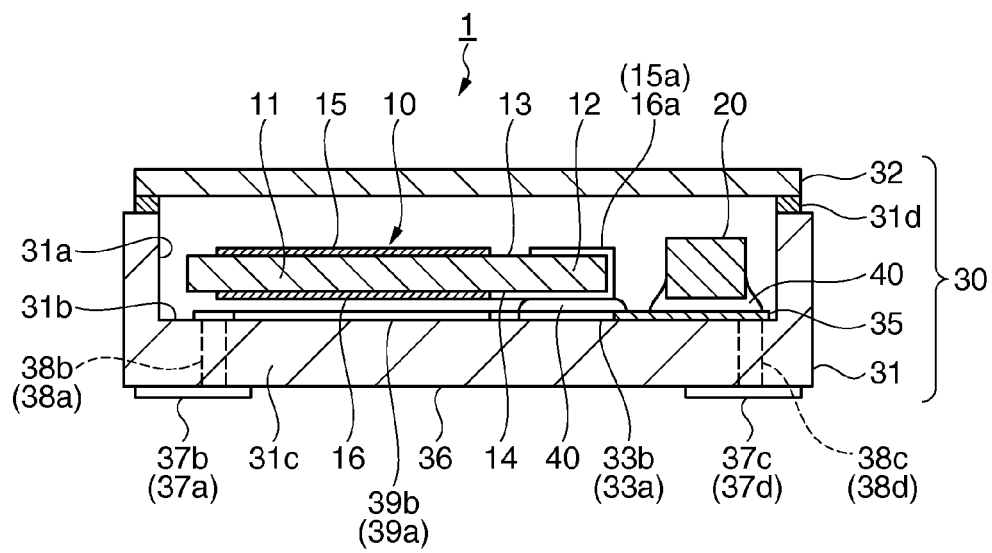
FIG. 1B is a schematic cross-sectional view along the A-A line shown in FIG. 1A.

FIGS. 1A and 1B are a schematic plan view and a schematic cross-sectional view, respectively, showing a general configuration of the quartz crystal vibrator according to the first embodiment. FIG. 1A is the schematic plan view viewed downward from a lid (a lid member) side, and FIG. 1B is the schematic cross-sectional view along the A-A line shown in FIG. 1A. It should be noted that in each of the plan view of FIG. 1A and the following plan views, some of the constituents including the lid are omitted for the sake of convenience of explanation. Further, in each of the drawings described below, the dimensional ratio of each of the constituents is different from the actual device for the sake of easier understanding.

As shown in FIGS. 1A and 1B, a quartz crystal vibrator 1 is provided with a quartz crystal resonator element 10 as a resonator element, a thermistor 20 as a thermo-sensitive element for detecting the temperature, and a package 30 as a container for incorporating the quartz crystal resonator element 10 and the thermistor 20.

The quartz crystal resonator element 10 is of an AT-cut type carved out at a predetermined angle from, for example, a law stone of quartz crystal (lumbered quartz crystal), and has a vibrating section 11 formed to have a plate shape having a roughly rectangular planer shape and vibrating in a thickness-shear vibration mode, and a base section 12 connected to the vibrating section 11.

The quartz crystal resonator element 10 has extraction electrodes 15a, 16a, which are extracted from excitation electrodes 15, 16 each having a roughly rectangular shape and formed on one principal surface 13 and the other principal surface 14 of the vibrating section 11, respectively, provided to the base section 12 as an end portion.

The extraction electrode 15*a* is extracted from the excitation electrode 15 on the one principal surface 13 along the longitudinal direction (a direction of a line connecting the base section 12 and the vibrating section 11 to each other, a lateral direction of the sheet of the drawing) of the quartz crystal resonator element 10 to the base section 12, then wraps around the base section 12 to the other principal surface 14 along a side surface of the base section 12, and then extends to the vicinity of the excitation electrode 16 on the other principal surface 14.

The extraction electrode 16*a* is extracted from the excitation electrode 16 on the other principal surface 14 along the longitudinal direction of the quartz crystal resonator element 10 to the base section 12, then wraps around the base section 12 to the one principal surface 13 along the side surface of the base section 12, and then extends to the vicinity of the excitation electrode 15 on the one principal surface 13.

The excitation electrodes 15, 16 and the extraction electrodes 15*a*, 16*a* are each formed of a metal coating having a configuration of, for example, stacking gold on a foundation layer made of chromium.

The thermistor 20 is, for example, a chip type (having a rectangular solid shape) thermo-sensitive element (thermo-sensitive resistor element), which is a resistive element having electrodes 21, 22 disposed at both end portions, and has a large variation in electrical resistance with the temperature variation.

As the thermistor 20, there is used, for example, a thermistor called a negative temperature coefficient (NTC) thermistor having a resistance reduced in accordance with rise in temperature. The NTC thermistor varies in resistance value in proportion to the temperature, and is therefore heavily used as a temperature sensor.

The thermistor 20 is housed in the package 30, and detects the temperature (apparent temperature of the quartz crystal resonator element 10) in the vicinity of the quartz crystal resonator element 10 to thereby serve a function of making a contribution to the compensation (correction) of a frequency variation due to the temperature variation of the quartz crystal resonator element 10.

The package 30 is provided with a package base 31 as a container main body having a recessed section 31*a* having a roughly rectangular planar shape and for housing the quartz crystal resonator element 10 and the thermistor 20, and a lid (a lid member) 32 having a plate shape and for covering the recessed section 31*a* of the package base 31, and is formed to have a roughly rectangular solid shape.

A ceramics insulating material such as an aluminum oxide sintered body obtained by molding, stacking, and then calcining a ceramic green sheet, a mullite sintered body, an aluminum nitride sintered body, a silicon carbide sintered body, or a glass ceramics sintered body is used for the package base 31.

It should be noted that the typical thermal conductivity of ceramics is in a range of 14 through 21 W/m·K.

As the lid 32, there is used the same material as that of the package base 31, or metal such as kovar or 42Alloy.

An inner bottom surface (a bottom surface in the inside) 31*b* of the recessed section 31*a* of the package base 31 as a mounting surface on which the quartz crystal resonator element 10 and the thermistor 20 are mounted is provided with a plurality of (two in this case) electrode pads 33*a*, 33*b* each having a roughly rectangular shape for supporting the quartz crystal resonator element 10 disposed at positions opposed respectively to the extraction electrodes 15*a*, 16*a* of the quartz crystal resonator element 10.

The quartz crystal resonator element 10 is attached with the extraction electrodes 15*a*, 16*a* supported by (fixed to) the electrode pads 33*a*, 33*b* via an electrically-conductive adhesive (a fixation member) 40 such as epoxy resin, silicone resin, or polyimide resin each mixed with an electrically-conductive material such as a metal filler.

The thermistor 20 is disposed in the vicinity of the base section 12 of the quartz crystal resonator element 10 on the right side of the sheet of the drawing along a direction (a vertical direction of the sheet of the drawing) intersecting with the longitudinal direction (the lateral direction of the sheet of the drawing) of the quartz crystal resonator element 10 side by side with the quartz crystal resonator element 10. Further, the thermistor 20 is disposed so that the longitudinal direction (the direction of a line connecting the electrodes 21, 22 to each other) thereof intersects (orthogonally, here) with the longitudinal direction of the quartz crystal resonator element 10.

The inner bottom surface 31*b* of the package base 31 is provided with electrode pads 34*a*, 34*b* each having a roughly rectangular shape disposed at positions opposed respectively to the electrodes 21, 22 of the thermistor 20.

The thermistor 20 has the electrodes 21, 22 fixed to the electrode pads 34*a*, 34*b* via the electrically-conductive adhesive 40.

The inner bottom surface 31*b* of the package base 31 is provided with a wiring pattern 35 extracted from the electrode pad 33*a* extends to an end portion, which is located on the right side of the sheet of the drawing, of the recessed section 31*a* of the package base 31 through an area between the electrode pads 34*a*, 34*b*.

Thus, it results that the wiring pattern 35 overlaps the thermistor 20 in a plan view. It should be noted that the thermistor 20 is provided with an insulating property except the electrodes 21, 22, and therefore, even in the casein which the thermistor 20 has contact with the wiring pattern 35 in a part other than the electrodes 21, 22, there occurs no short circuit with the wiring pattern 35.

It should be noted that the thermistor 20 is preferably disposed so that the longitudinal direction intersects (orthogonally, here) with the longitudinal direction (the lateral direction of the sheet of the drawing) of the package base 31. Thus, in the quartz crystal vibrator 1, it is possible to suppress the degradation of the fixation strength (the bonding strength) of the thermistor 20 caused by warpage (warpage in the longitudinal direction tends to be large) of the package base 31.

On the four corners of an outer bottom surface (a bottom surface in the outside) 36 as an exterior surface of the package base 31, there are disposed electrode terminals 37*a*, 37*b*, 37*c*, and 37*d* each having a roughly rectangular shape and used when the quartz crystal vibrator 1 is installed in an external member such as an electronic apparatus.

The electrode terminals 37*a*, 37*b*, 37*c*, and 37*d* are connected respectively to the electrode pads 33*a*, 33*b*, 34*a*, and 34*b* via internal wiring.

The details are as follows. The electrode terminal 37*a* is connected to the electrode pad 33*a* via a conductive via hole (a conductive electrode obtained by filling a through hole with metal or a material having an electrical conductivity) 38*a* penetrating a bottom section 31*c* of the package base 31 and an internal wiring pattern 39*a*, and the electrode terminal 37*b* is connected to the electrode pad 33*b* via a conductive via hole 38*b* and an internal wiring pattern 39*b*.

Further, the electrode terminal 37c is connected to the electrode pad 34a via a conductive via hole 38c and an internal wiring pattern 39c, and the electrode terminal 37d is connected to the electrode pad 34b via a conductive via hole 38d and an internal wiring pattern 39d.

It should be noted that the conductive via holes 38a, 38b, 38c, and 38d are disposed so as to overlap the electrode terminals 37a, 37b, 37c, and 37d, respectively, in a plan view.

The electrode pads 33a, 33b, 34a, and 34b, the wiring pattern 35, the electrode terminals 37a, 37b, 37c, and 37d, the conductive via holes 38a, 38b, 38c, and 38d, and the internal wiring patterns 39a, 39b, 39c, and 39d are each formed of metal coating obtained by stacking coated layers of, for example, nickel and gold on a metalization layer of, for example, tungsten or molybdenum using a plating process.

It should be noted that the thermal conductivity of tungsten is about 173 W/m·K, and the thermal conductivity of molybdenum is about 138 W/m·K.

In the quartz crystal vibrator 1, in the condition in which the quartz crystal resonator element 10 is supported by the electrode pads 33a, 33b of the package base 31, the recessed section 31a of the package base 31 is covered by the lid 32, and the package base 31 and the lid 32 are bonded to each other with a bonding member 31d such as a seam ring, low-melting-point glass, or an adhesive to thereby airtightly seal the recessed section 31a of the package base 31.

It should be noted that the inside of the recessed section 31a, which is sealed airtightly, of the package base 31 is in a reduced pressure vacuum state (a state with a high degree of vacuum), or a state of being filled with an inert gas such as nitrogen, helium, or argon.

A thickness-shear vibration is excited in the quartz crystal resonator element 10 in response to a drive signal externally applied via the electrode terminals 37a, 37b, the electrode pads 33a, 33b, the extraction electrodes 15a, 16a, the excitation electrodes 15, 16, and so on, and the quartz crystal vibrator 1 resonates (oscillates) at a predetermined frequency.

Further, the thermistor 20 functions as a temperature sensor for detecting the temperature (apparent temperature of the quartz crystal resonator element 10) in the vicinity of the quartz crystal resonator element 10 in the package base 31, and the quartz crystal vibrator 1 outputs a detection signal via the electrode terminals 37c, 37d.

As described above, the quartz crystal vibrator 1 according to the embodiment of the invention is provided with the electrode pads 33a, 33b, on which the quartz crystal resonator element 10 is attached, disposed on the inner bottom surface 31b, on which the quartz crystal resonator element 10 and the thermistor 20 are mounted, of the package base 31. Further, the quartz crystal vibrator 1 has a configuration in which the wiring pattern 35 (with the thermal conductivity in a range of about 138 through 173 W/m·K) extracted from the electrode pad 33a, and having the thermal conductivity several times through roughly 10 times higher than that of the package base 31 main body (with the thermal conductivity in a range of about 14 through 21 W/m·K) overlaps the thermistor 20 in a plan view.

Thus, in the quartz crystal vibrator 1, the thermal conduction between the quartz crystal resonator element 10 and the thermistor 20 is expedited compared to the case in which the wiring pattern 35 extracted from the electrode pad 33a fails to overlap the thermistor 20 in a plan view, and therefore, it is possible to reduce the difference between the actual temperature of the quartz crystal resonator element 10, which varies in accordance with the variation in ambient temperature, and the temperature (the apparent temperature of the quartz crystal resonator element 10) detected by the thermistor 20 in a short time.

Further, in the quartz crystal vibrator 1, the base section 12 as one end of the quartz crystal resonator element 10 is supported by the electrode pads 33a, 33b, and the thermistor 20 is disposed along the base section 12 side of the quartz crystal resonator element 10. Therefore, in the quartz crystal vibrator 1, the distance between the base section 12 of the quartz crystal resonator element 10 and the thermistor 20 is reduced compared to the case in which, for example, the thermistor 20 is disposed on the tip side of the vibrating section 11, which is the other end portion on the opposite side to the base section 12 of the quartz crystal resonator element 10.

In other words, in the quartz crystal vibrator 1, the time until the temperature of the base section 12 of the quartz crystal resonator element 10 and the temperature of the thermistor 20 become roughly equal to each other is reduced.

As a result, in the quartz crystal vibrator 1, the difference between the actual temperature of the quartz crystal resonator element 10, which varies in accordance with the variation in the ambient temperature, and the temperature detected by the thermistor 20 can be reduced in a short time.

According to these configurations, in the quartz crystal resonator element 1, the accuracy of the temperature compensation circuit, which compensates the variation in the frequency due to the temperature variation of the quartz crystal resonator element 10 based on the temperature detected by the thermistor 20, can further be improved.

It should be noted that the wiring pattern 35 can be extracted from the electrode pad 33b instead of the electrode pad 33a, or can be extracted respectively from the electrode pads 33a, 33b (in this case, a pair of wiring patterns 35 are provided).

Modified Example

Then, a modified example of the first embodiment will be explained.

Figure 2:
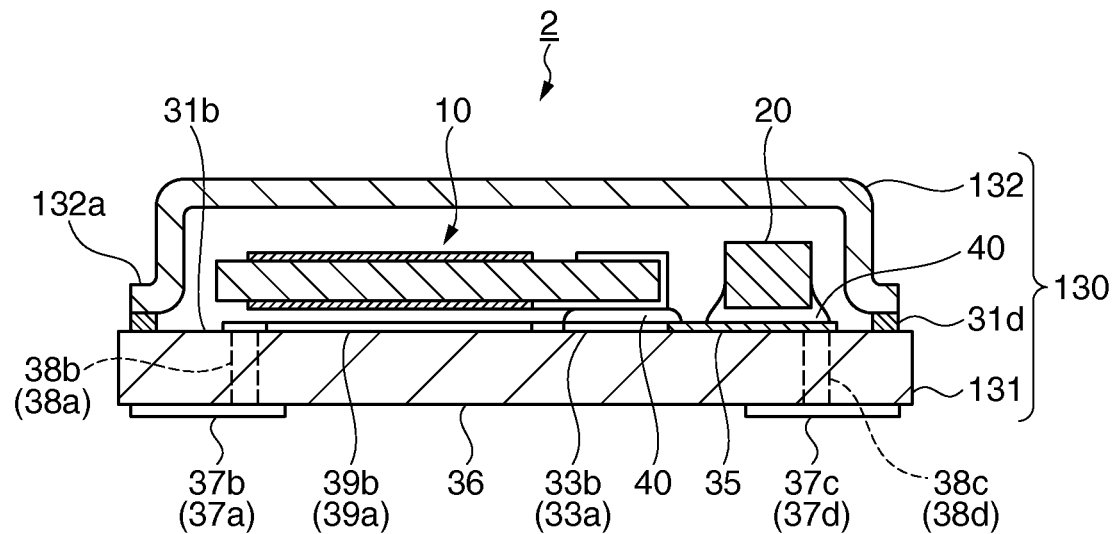
FIG. 2 is a schematic cross-sectional view showing a general configuration of a quartz crystal vibrator according to a modified example of the first embodiment.

FIG. 2 is a schematic cross-sectional view showing a general configuration of a quartz crystal vibrator according to a modified example of the first embodiment.

It should be noted that the sections common to the first embodiment and the modified example are denoted with the same reference numerals, and the detailed explanation thereof will be omitted, while the sections different from those of the first embodiment will mainly be explained.

As shown in FIG. 2, a quartz crystal vibrator 2 according to the modified example is different in the configuration of a package 130 compared to the first embodiment.

In the quartz crystal vibrator 2, the package 130 is provided with a package base 131 having a plate shape, and a lid 132 having a cap-like shape and for covering the package base 131.

A ceramics insulating material similar to that in the first embodiment is used for the package base 131.

The lid 132 is formed to have a cap-like shape with a flange section 132a disposed in whole circumference using metal such as kovar or 42Alloy.

In the quartz crystal vibrator 2, there is assured an internal space allowing the quartz crystal resonator element 10 to vibrate due to the bulge of the cap portion of the lid 132.

The lid 132 has the flange section 132a bonded to the inner bottom surface 31b of the package base 131 with the bonding member 31d. It should be noted that in the case in which the internal wiring at least partially exists in the bonding area, an insulating material such as low-melting-point glass is used as the bonding member 31d.

Similarly to the first embodiment, the internal space of the quartz crystal vibrator 2, which is sealed airtightly due to the bonding described above, is in a reduced pressure vacuum state (a state with a high degree of vacuum), or a state of being filled with an inert gas such as nitrogen, helium, or argon.

According to this configuration, since the package base 131 has a plate shape, which is simpler than the shape of the package base 31 provided with the recessed section 31a as in the first embodiment, the quartz crystal vibrator 2 has an advantage that the package base 131 can easily be manufactured, in addition to the similar advantages to those of the first embodiment.

It should be noted that the configuration of the package 130 provided with the package base 131 having the plate shape and the lid 132 having the cap-like shape described above can also be applied to each of the following embodiments.

Second Embodiment

Then, a quartz crystal vibrator according to a second embodiment will be explained.

Figure 3A:
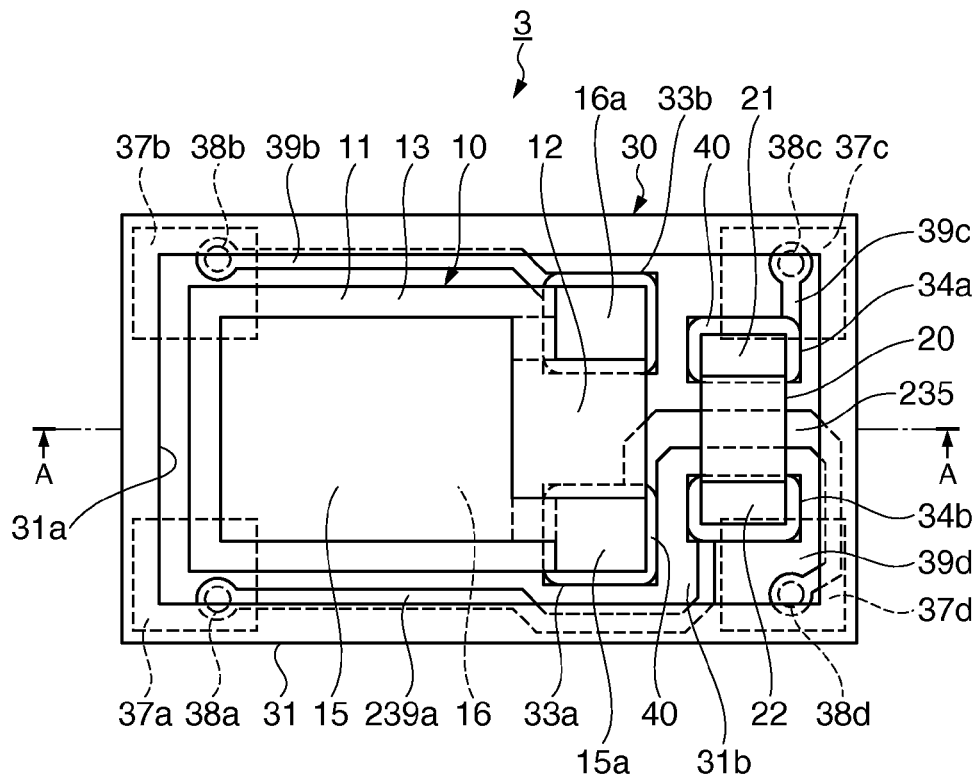
FIG. 3A is a schematic plan view, which shows a general configuration of a quartz crystal vibrator according to a second embodiment of the invention, and is looked down from the lid side.
Figure 3B:
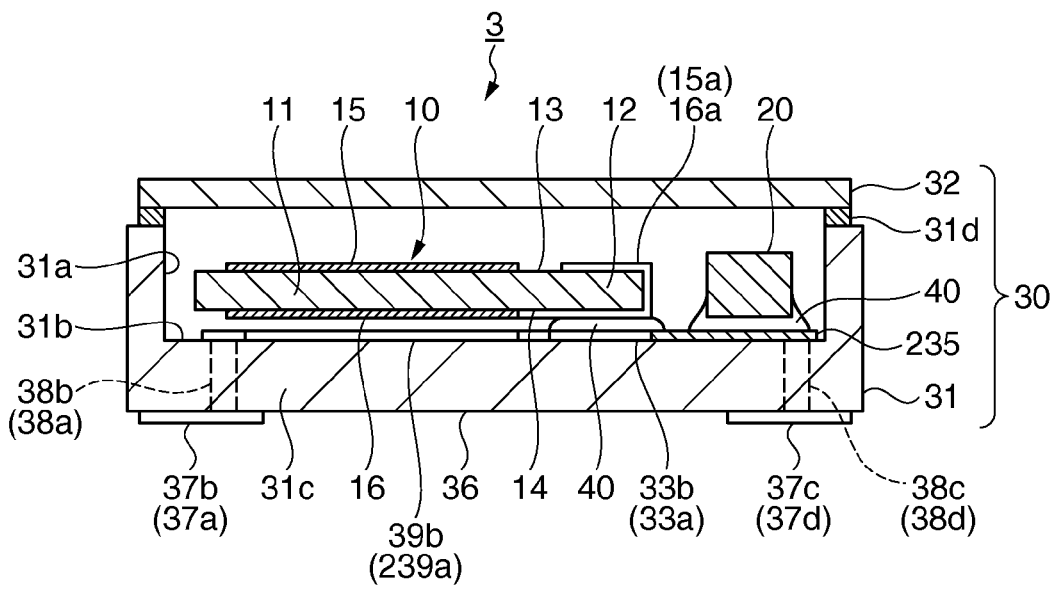
FIG. 3B is a schematic cross-sectional view along the A-A line shown in FIG. 3A.

FIGS. 3A and 3B are a schematic plan view and a schematic cross-sectional view, respectively, showing a general configuration of the quartz crystal vibrator according to the second embodiment. FIG. 3A is the schematic plan view viewed downward from the lid side, and FIG. 3B is the schematic cross-sectional view along the A-A line shown in FIG. 3A.

It should be noted that the sections common to the first embodiment and the modified example are denoted with the same reference numerals, and the detailed explanation thereof will be omitted, while the sections different from those of the first embodiment will mainly be explained.

As shown in FIGS. 3A and 3B, a quartz crystal vibrator 3 according to the second embodiment is different in the layout of a wiring pattern 235 and an internal wiring pattern 239a from the first embodiment.

In the quartz crystal vibrator 3, the wiring pattern 235 extracted from the electrode pad 33a is laid between the electrode pad 34a and the electrode pad 34b so as to overlap the thermistor 20 in a plan view, and is then connected to the electrode terminal 37d via the conductive via hole 38d disposed in the vicinity of the electrode pad 34b while circumventing the electrode pad 34b.

Further, the electrode pad 34b is connected to the electrode terminal 37a via the internal wiring pattern 239a laid so as to circumvent the electrode pad 33a and the conductive via hole 38a.

It should be noted that it is preferable for the internal wiring pattern 239a to circumvent the quartz crystal resonator element 10 in the plan view from the viewpoint of avoiding electrical interference (e.g., a stray capacitance and an electrostatic capacitance).

According to this configuration, a thickness-shear vibration is excited in the quartz crystal resonator element 10 in response to a drive signal externally applied via the electrode terminals 37b, 37d, the electrode pads 33a, 33b, the extraction electrodes 15a, 16a, the excitation electrodes 15, 16, and so on, and the quartz crystal vibrator 3 resonates (oscillates) at a predetermined frequency.

Further, the thermistor 20 functions as a temperature sensor for detecting the temperature in the vicinity of the quartz crystal resonator element 10 in the package base 31, and the quartz crystal vibrator 3 outputs a detection signal via the electrode terminals 37a, 37c.

As described above, in the quartz crystal vibrator 3, the wiring pattern 235 extracted from the electrode pad 33a and partially overlapping the thermistor 20 in a plan view is connected to the electrode terminal 37d. According to this configuration, in addition to similar advantages to those of the first embodiment, the quartz crystal vibrator 3 has an advantage that the wiring pattern 235 can be used for connecting the quartz crystal resonator element 10 and the electrode terminal 37d to each other besides the speeding-up of the thermal conduction between the quartz crystal resonator element 10 and the thermistor 20, and an effective layout of the wiring pattern 235 becomes possible.

It should be noted that the wiring pattern 235 can also be extracted from the electrode pad 33b instead of the electrode pad 33a. In this case, the layout of the internal wiring pattern will be changed appropriately.

Further, the wiring patterns 235 can also be extracted respectively from the electrode pads 33a, 33b. In this case, the layout of the internal wiring patterns will also be changed appropriately.

Third Embodiment

Then, a quartz crystal vibrator according to a third embodiment will be explained.

Figure 4A:
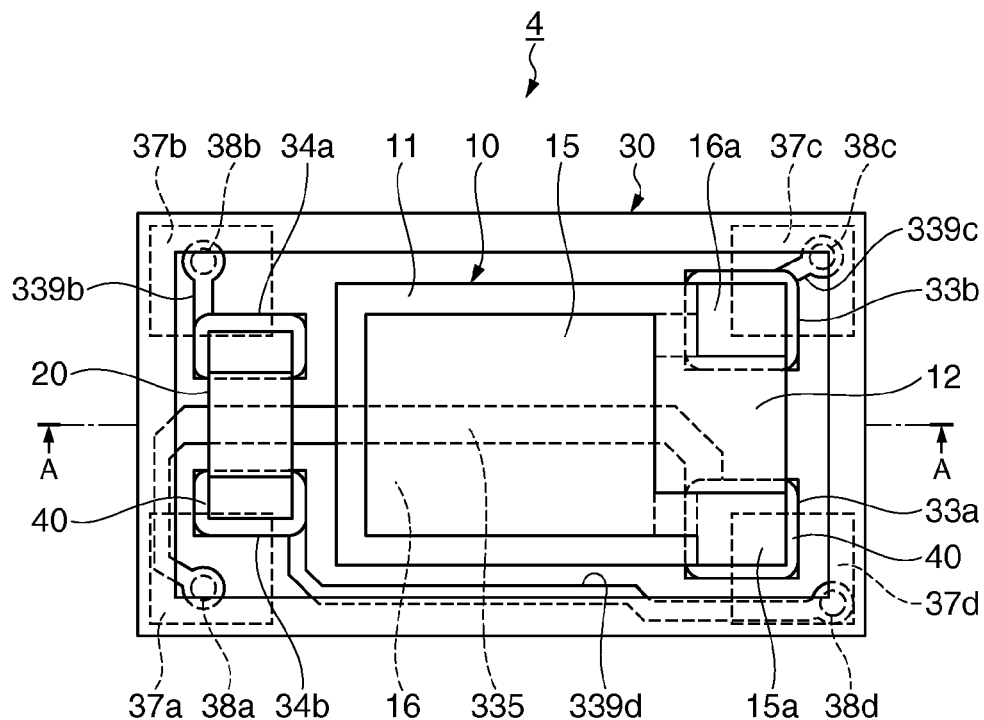
FIG. 4A is a schematic plan view, which shows a general configuration of a quartz crystal vibrator according to a third embodiment of the invention, and is looked down from the lid side.
Figure 4B:
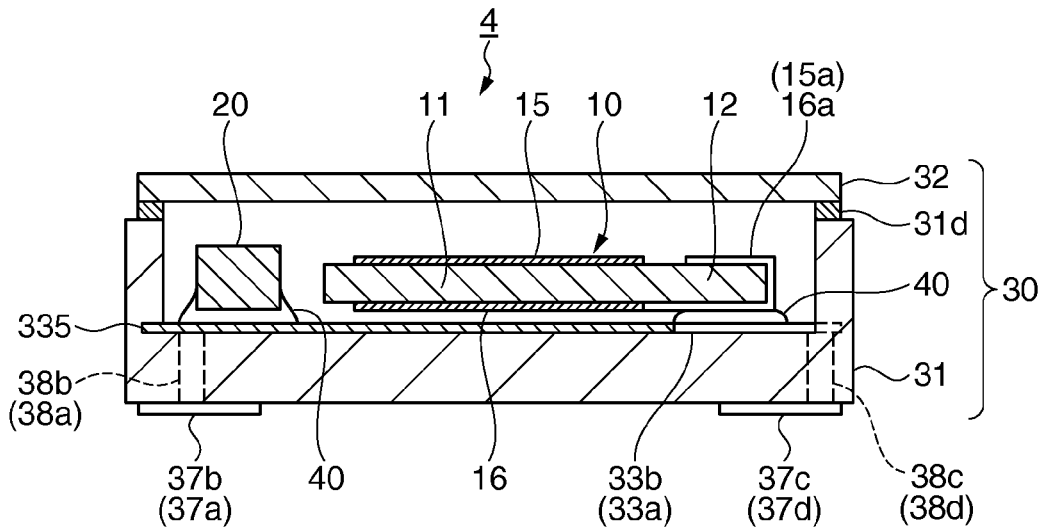
FIG. 4B is a schematic cross-sectional view along the A-A line shown in FIG. 4A.

FIGS. 4A and 4B are a schematic plan view and a schematic cross-sectional view, respectively, showing a general configuration of the quartz crystal vibrator according to the third embodiment. FIG. 4A is the schematic plan view viewed downward from the lid side, and FIG. 4B is the schematic cross-sectional view along the A-A line shown in FIG. 4A.

It should be noted that the sections common to the first embodiment are denoted with the same reference numerals, and the detailed explanation thereof will be omitted, while the sections different from those of the first embodiment will mainly be explained.

As shown in FIGS. 4A and 4B, a quartz crystal vibrator 4 according to the third embodiment is different in the arrangement of the thermistor 20, the layout of a wiring pattern 335, and so on from the first embodiment.

In the quartz crystal vibrator 4, the thermistor 20 is arranged along the tip side (the left side of the sheet of the drawing) of the vibrating section 11, which is the other end portion on the opposite side to the base section 12 of the quartz crystal resonator element 10.

Further, in the quartz crystal vibrator 4, the wiring pattern 335 extracted from the electrode pad 33a is laid between the electrode pad 34a and the electrode pad 34b so as to pass immediately below the vibrating section 11, and overlap the thermistor 20 in a plan view, and is then connected to the electrode terminal 37a via the conductive via hole 38a while circumventing the electrode pad 34b.

It should be noted that the electrode pad 33b is connected to the electrode terminal 37c via an internal wiring pattern 339c and the conductive via hole 38c, the electrode pad 34a is connected to the electrode terminal 37b via an internal wiring pattern 339b and the conductive via hole 38b, and the electrode pad 34b is connected to the electrode terminal 37d via an internal wiring pattern 339d and the conductive via hole 38d.

It should be noted that it is preferable for the internal wiring pattern 339d to circumvent the quartz crystal resonator element 10 in the plan view from the viewpoint of avoiding electrical interference.

According to this configuration, a thickness-shear vibration is excited in the quartz crystal resonator element 10 in response to a drive signal externally applied via the electrode terminals 37a, 37c, the electrode pads 33a, 33b, the extraction electrodes 15a, 16a, the excitation electrodes 15, 16, and so on, and the quartz crystal vibrator 4 resonates (oscillates) at a predetermined frequency.

Further, the thermistor 20 functions as a temperature sensor for detecting the temperature in the vicinity of the quartz crystal resonator element 10 in the package base 31, and the quartz crystal vibrator 4 outputs a detection signal via the electrode terminals 37b, 37d.

As described above, in the quartz crystal vibrator 4, the base section 12 of the quartz crystal resonator element 10 is supported by the electrode pads 33a, 33b, and the thermistor 20 is disposed along the tip side of the vibrating section 11 on the opposite side to the base section 12 of the quartz crystal resonator element 10.

In other words, in the quartz crystal vibrator 4, the base section 12 (the electrode pads 33a, 33b) of the quartz crystal resonator element 10 and the thermistor 20 (the electrode pads 34a, 34b) are more distant from each other compared to the first embodiment.

According to this configuration, in addition to the advantages similar to those of the first embodiment, the quartz crystal resonator element 4 has an advantage that the interference (specifically, for example, short circuit between the quartz crystal resonator element 10 and the thermistor 20 due to outflow of the electrically-conductive adhesive 40) of the electrically-conductive adhesive 40 for fixing both of the quartz crystal resonator element 10 and the thermistor 20 in the package base 31 can easily be avoided when mounting (installing) the quartz crystal resonator element 10 and the thermistor 20 in the package 30.

It should be noted that in the quartz crystal vibrator 4, it is preferable that the length of the wiring pattern 335 and the length of the internal wiring pattern 339d are set to be roughly equal to each other from the viewpoint of roughly equalizing the thermal conduction velocity between a path from the electrode terminal 37a to the electrode pad 33a and a path from the electrode terminal 37d to the electrode pad 34b.

According to this configuration, in the quartz crystal vibrator 4, it becomes possible to reduce the time until the temperature of the base section 12 of the quartz crystal resonator element 10 and the temperature of the thermistor 20 become roughly equal to each other.

It should be noted that the wiring pattern 335 can also be extracted from the electrode pad 33b instead of the electrode pad 33a. In this case, the layout of the internal wiring pattern will be changed appropriately.

Further, the wiring patterns 335 can also be extracted respectively from the electrode pads 33a, 33b. In this case, the layout of the internal wiring patterns will also be changed appropriately.

Fourth Embodiment

Then, a quartz crystal vibrator according to a fourth embodiment will be explained.

Figure 5A:
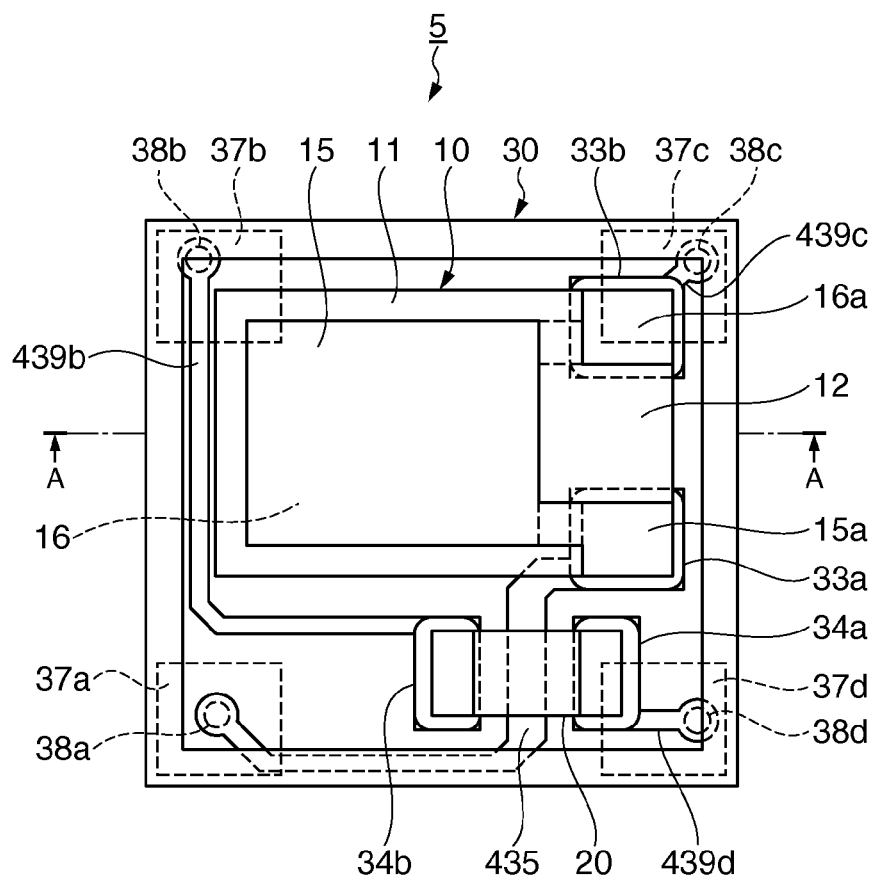
FIG. 5A is a schematic plan view, which shows a general configuration of a quartz crystal vibrator according to a fourth embodiment of the invention, and is looked down from the lid side.
Figure 5B:
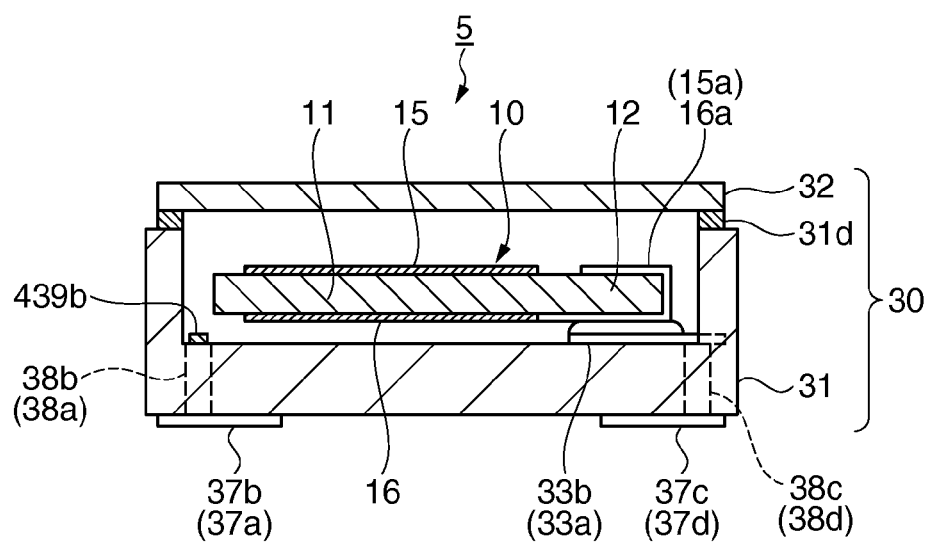
FIG. 5B is a schematic cross-sectional view along the A-A line shown in FIG. 5A.

FIGS. 5A and 5B are a schematic plan view and a schematic cross-sectional view, respectively, showing a general configuration of the quartz crystal vibrator according to the fourth embodiment. FIG. 5A is the schematic plan view viewed downward from the lid side, and FIG. 5B is the schematic cross-sectional view along the A-A line shown in FIG. 5A.

It should be noted that the sections common to the first embodiment are denoted with the same reference numerals, and the detailed explanation thereof will be omitted, while the sections different from those of the first embodiment will mainly be explained.

As shown in FIGS. 5A and 5B, a quartz crystal vibrator 5 according to the fourth embodiment is different in the arrangement of the thermistor 20, the layout of a wiring pattern 435, and so on from the first embodiment.

In the quartz crystal vibrator 5, the thermistor 20 is arranged side by side with the quartz crystal resonator element 10 along a direction intersecting with the longitudinal direction of the quartz crystal resonator element 10.

In other words, the quartz crystal resonator element 10 has a first dimension along a first direction, and a second dimension along a second direction perpendicular to the first direction, wherein the second dimension is smaller than the first dimension, and the thermistor 20 is disposed side by side with the quartz crystal resonator element 10 along the second direction in a plan view.

Further, the thermistor 20 is disposed so that the longitudinal direction thereof coincides with the longitudinal direction of the quartz crystal resonator element 10.

In the quartz crystal vibrator 5, the wiring pattern 435 extracted from the electrode pad 33a is laid between the electrode pad 34a and the electrode pad 34b so as to overlap the thermistor 20 in a plan view, and is then connected to the electrode terminal 37a via the conductive via hole 38a while circumventing the electrode pad 34b.

It should be noted that the electrode pad 33b is connected to the electrode terminal 37c via an internal wiring pattern 439c and the conductive via hole 38c, the electrode pad 34a is connected to the electrode terminal 37d via an internal wiring pattern 439d and the conductive via hole 38d, and the electrode pad 34b is connected to the electrode terminal 37b via an internal wiring pattern 439b and the conductive via hole 38b.

It should be noted that it is preferable for the internal wiring pattern 439b to circumvent the quartz crystal resonator element 10 in the plan view from the viewpoint of avoiding electrical interference.

According to this configuration, a thickness-shear vibration is excited in the quartz crystal resonator element 10 in response to a drive signal externally applied via the electrode terminals 37a, 37c, the electrode pads 33a, 33b, the extraction electrodes 15a, 16a, the excitation electrodes 15, 16, and so on, and the quartz crystal vibrator 5 resonates (oscillates) at a predetermined frequency.

Further, the thermistor 20 functions as a temperature sensor for detecting the temperature in the vicinity of the quartz crystal resonator element 10 in the package base 31, and the quartz crystal vibrator 5 outputs a detection signal via the electrode terminals 37b, 37d.

As described above, in the quartz crystal vibrator 5, the thermistor 20 is arranged side by side with the quartz crystal resonator element 10 along the longitudinal direction of the quartz crystal resonator element 10.

According to this configuration, in addition to the advantages similar to those of the first embodiment, the quartz crystal vibrator 5 has an advantage that the size in the longitudinal direction (the lateral direction of the sheet of the drawing) of the package 30 can be reduced by the area corresponding to the layout space of the thermistor 20 compared to the first embodiment in which the thermistor 20 is arranged side by side with the quartz crystal resonator element 10 along the direction intersecting with the longitudinal direction of the quartz crystal resonator element 10.

As a result, in the quartz crystal vibrator 5, the degree of freedom of the installation layout to an external member such as an electronic apparatus can be enhanced.

It should be noted that the wiring pattern 435 can also be extracted from the electrode pad 33b instead of the electrode pad 33a. In this case, the layout of the internal wiring pattern will be changed appropriately.

Further, the wiring patterns 435 can also be extracted respectively from the electrode pads 33a, 33b. In this case, the layout of the internal wiring patterns will also be changed appropriately.

Further, the thermistor 20 can also be disposed at a position shifted toward the tip side (the left side of the sheet of the drawing) of the vibrating section 11 from the position shown in the drawing, or can also be disposed at position across the quartz crystal resonator element 10 from the position shown in the drawing.

Further, the thermistor 20 is disposed along the direction in which the longitudinal direction thereof intersects with the longitudinal direction of the quartz crystal resonator element 10.

Fifth Embodiment

Then, the electronic apparatus equipped with the resonator device described above will be explained citing a cellular phone as an example.

Figure 6:
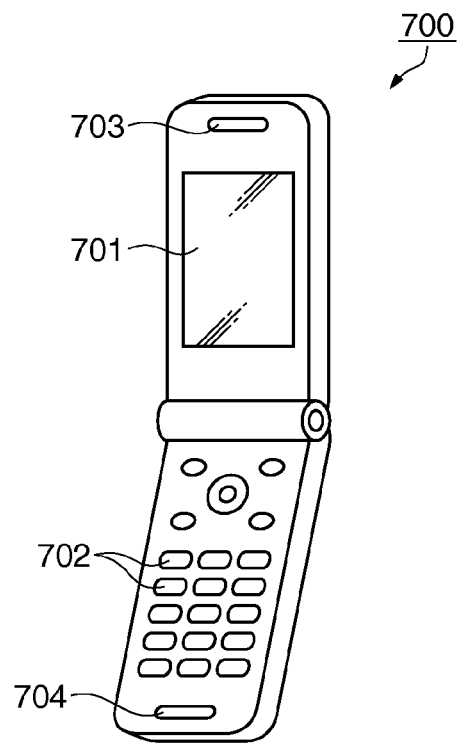
FIG. 6 is a schematic perspective view showing a cellular phone according to a fifth embodiment of the invention.

FIG. 6 is a schematic perspective view showing the cellular phone according to a fifth embodiment.

A cellular phone 700 is equipped with either one of the quartz crystal vibrators (1 through 5) as the resonator devices described as the embodiments and the modified example.

The cellular phone 700 shown in FIG. 6 uses either one of the quartz crystal resonator elements (1 through 5) described above as, for example, a timing device such as a reference clock oscillation source, and is configured further including a liquid crystal display device 701, a plurality of operation buttons 702, an ear piece 703, and a mouthpiece 704.

According to this configuration, since the cellular phone 700 is equipped with either one of the quartz crystal vibrators (1 through 5), and therefore has the advantages explained in each of the embodiments and the modified example reflected thereon, and can exert a superior performance.

It should be noted that the configuration of the cellular phone 700 is not limited to the type shown in the drawing, but can also be of a so-called smartphone type.

The quartz crystal vibrators described above can preferably be used as a timing device for an electronic book, a personal computer, a television set, a digital still camera, a video camera, a video cassette recorder, a car navigation system, a pager, a personal digital assistance, an electric calculator, a word processor, a workstation, a video phone, a POS terminal, and a device equipped with a touch panel besides the cellular phone such as the cellular phone 700 described above, and in either case, there can be provided the electronic device on which the advantages explained in the embodiments and the modified example described above are reflected.

Sixth Embodiment

Then, the moving object equipped with the resonator devices described above will be explained citing a vehicle as an example.

Figure 7:
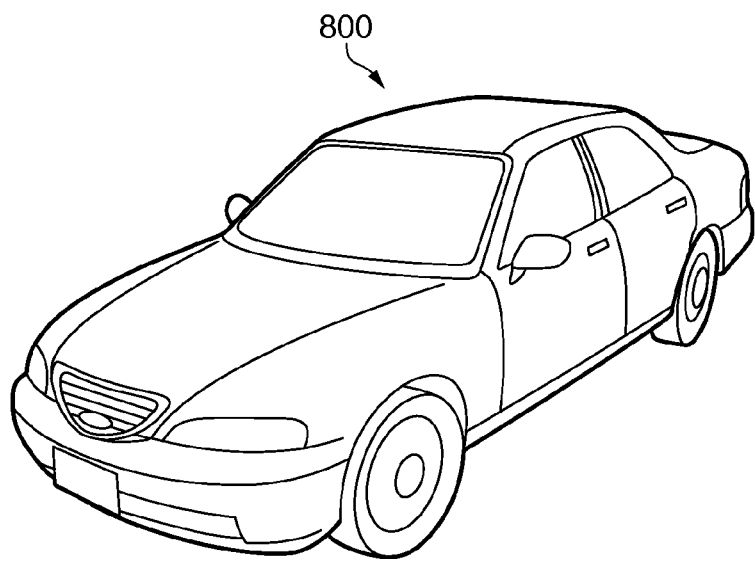
FIG. 7 is a schematic perspective view showing a vehicle according to a sixth embodiment of the invention.

FIG. 7 is a schematic perspective view showing the vehicle according to a sixth embodiment.

A vehicle 800 is provided with either one of the quartz crystal vibrators (1 through 5) described above. The vehicle 800 uses either one of the quartz crystal vibrators (1 through 5) described above as a timing device for generating the reference clock for, for example, a variety of electronically-controlled devices (e.g., an electronically-controlled fuel injection device, an electronically-controlled ABS device, and an electronically-controlled constant-speed running device) installed in the vehicle 800.

According to this configuration, since the vehicle 800 is equipped with either one of the quartz crystal vibrators (1 through 5), and therefore has the advantages explained in each of the embodiments and the modified example reflected thereon, and can exert a superior performance.

The quartz crystal vibrators described above can preferably be used as the timing device for the moving objects including, for example, a self-propelled robot, a self-propelled carrying apparatus, a train, a boat and ship, an airplane, and an artificial satellite besides the vehicle 800 described above, and in either case, there can be provided the moving object on which the advantages explained in the embodiments and the modified example described above are reflected.

It should be noted that the shape of the quartz crystal resonator element 10 is not limited to the type of the plate shape shown in the drawings, but a type (a convex type, a bevel type, and a mesa type) thick in the center portion and thin in the peripheral portion, or a type (an inverted mesa type) thin in the center portion and thick in the peripheral portion can also be adopted by contraries.

Further, the material of the resonator element is not limited to the quartz crystal, but can be a piezoelectric substance such as lithium tantalate ($LiTaO_3$), lithium tetraborate ($Li_2B_4O_7$), lithiumniobate ($LiNbO_3$), lead zirconium titanate (PZT), zinc oxide (ZnO), or aluminum nitride (AlN), or a semiconductor such as silicon (Si).

Further, the drive method of the thickness-shear vibration can be the electrostatic drive using the Coulomb force besides those using the piezoelectric effect of the piezoelectric substance.

It should be noted that it is obvious that the configuration of any of the embodiments can be applied to the configuration in which the resonator element and the thermo-sensitive element are installed in separate housing sections (e.g., housing sections like an H package) of the container. Specifically, there is provided a configuration in which the wiring pattern extracted from the electrode pad for supporting the resonator element in one housing section reaches the other housing section via a conductive via hole and so on, and is laid so as to overlap the thermo-sensitive element housed there in a plan view.

The entire disclosure of Japanese Patent Application No. 2012-260742, filed Nov. 29, 2012 is expressly incorporated by reference herein.

What is claimed is:

1. A resonator device comprising:
   a resonator element;
   a thermo-sensitive element; and
   a container in which the resonator element and the thermo-sensitive element are housed,
   wherein the container is provided with an electrode pad to which the resonator element is attached, and
   a wiring pattern, which extends from the electrode pad, and has a thermal conductivity higher than a thermal conductivity of the container, overlaps the thermo-sensitive element in a plan view.

2. The resonator device according to claim 1, further comprising:
   an electrode terminal disposed on an outer surface of the container,
   wherein the wiring pattern is connected to the electrode terminal.

3. The resonator device according to claim 1, wherein
   one end portion of the resonator element is attached to the electrode pad, and the thermo-sensitive element is disposed on an electrode pad side in the plan view.

4. The resonator device according to claim 1, wherein one end portion of the resonator element is attached to the electrode pad, and the thermo-sensitive element is disposed on the other end portion side opposite to the one end portion of the resonator element in the plan view.

5. The resonator device according to claim 1, wherein the resonator element has
- a first dimension along a first direction, and
- a second dimension along a second direction perpendicular to the first direction, the second dimension being shorter than the first dimension, and the thermo-sensitive element is arranged side by side with the resonator element along the second direction in the plan view.

6. An electronic apparatus comprising:

the resonator device according to claim 1.

7. An electronic apparatus comprising:

the resonator device according to claim 2.

8. A moving object comprising:

the resonator device according to claim 1.

9. A moving object comprising:

the resonator device according to claim 2.

* * * * *